United States Patent [19]

Lee

[11] Patent Number: 5,009,920
[45] Date of Patent: Apr. 23, 1991

[54] METHOD FOR APPLYING OPTICAL INTERFERENCE COATING

[75] Inventor: James C. Lee, Plymouth, Minn.
[73] Assignee: Honeywell Inc., Minneapolis, Minn.
[21] Appl. No.: 502,348
[22] Filed: Mar. 30, 1990
[51] Int. Cl.⁵ ............................................. B05D 3/06
[52] U.S. Cl. .................................... 427/9; 427/10; 427/38; 427/47; 427/164; 427/166; 427/255.2; 427/294; 427/296
[58] Field of Search ................. 427/10, 38, 47, 9, 166, 427/164, 255.2, 296, 294

[56] References Cited

U.S. PATENT DOCUMENTS

| | | | |
|---|---|---|---|
| 3,871,739 | 3/1975 | Poulsen | 350/1 |
| 3,953,652 | 4/1976 | Adiss, Jr. et al. | 428/412 |
| 4,096,315 | 6/1978 | Kubacki | 428/412 |
| 4,152,478 | 5/1979 | Takagi | 428/221 |
| 4,237,183 | 12/1980 | Fujiwara et al. | 428/336 |
| 4,579,639 | 4/1986 | Enomoto et al. | 204/192 N |
| 4,652,467 | 3/1987 | Brinker et al. | 427/246 |

OTHER PUBLICATIONS

"1989 Trends in Optical Coatings," by A. Thelen, in *Laser Focus World* of Jan. 1989.

Primary Examiner—Bernard Pianalto
Attorney, Agent, or Firm—John G. Shudy, Jr.

[57] ABSTRACT

Precision multilayer optical interference coating of substrates having complex topology using complementary shaped electrodes and plasma enhanced chemical vapor deposition within a chamber. The materials for the optical quality thin films are obtained from starting reactants of the form M-R where M denotes a metal atom and R denotes an organic component. These vapor phase starting reactants are brought into a reactive atmosphere of the chamber through a plurality of orifices in one of the shaped electrodes. The resulting substances are deposited as thin films upon the substrates with inherently superior scatter loss performance because of the low temperature nature and simple direct vapor-to-solid phase transformation path of the process.

13 Claims, 9 Drawing Sheets

BASIC PLASMA CHEMICAL VAPOR DISPOSITION SYSTEM

SINGLE VISOR ELECTRODE SYSTEM

DOUBLE VISOR ELECTRODE SYSTEM

MULTI-LENS FLAT PLATE ELECTRODE SYSTEM

MULTI-LENS TOROIDAL ELECTRODE SYSTEM

MULTI EYE SHIELD TOROIDAL ELECTRODE SYSTEM

SIDEVIEW OF A SINGLE LAYER PLASMA POLYMERIZED HMDS

SIDEVIEW OF A SINGLE LAYER PLASMA POLYMERIZED TETRAMETHYLTIN ON GLASS

SIDEVIEW OF A 167 LAYER PLASMA POLYMERIZED FILM THIS FILM PROVIDES AN O.D. OF 3 AT TWO REJECTION WAVELENGTHS.

SINGLE RECTANGULAR PART (LxW) ELECTRODE SYSTEM
FOR COATING FLAT SUBSTRATES

MULTI RLG MIRROR ELECTRODE SYSTEM

METHOD FOR APPLYING OPTICAL INTERFERENCE COATING

Development of the present invention was partially funded under Contract No. DAMD17-83-C-3043 with the U.S. Army.

BACKGROUND OF THE INVENTION

1. Field of the Invention

The present invention pertains to coating substrates and particularly to coating curved substrates. More particularly, the invention pertains to the application of multilayer optical interference coatings to curved polymeric substrates.

2. Related Art

Other approaches in the art involve surface treatment and coating processes which are primarily for non-optical purposes. None of the related art known to the applicant uses shaped electrode geometry for precision coating of substrates of complex topology.

The fundamental problem in applying high performance optical interference coatings (OICs) using conventional coating materials (such as $MgF_2$, $SiO_2$, $TiO_2$, etc.) to optical quality polymers (such as polycarbonate, CR-39, i.e., a specific resin, acrylic, etc.) is the basic physical property mismatches and incompatibilities between the inorganic coating materials and the organic substrate. The difference in the temperature dependent thermal expansion coefficient is particularly acute leading to very high levels of stress in such conventional coatings developed in only a few layers. Layer counts of about twenty are the practical limit for such coatings, which limits performance and design flexibility in many applications. The present invention circumvents this problem by permitting coating designs of several hundred layers to be applied to polymeric substrates of nearly any arbitrary geometry, including very thin (i.e., several mils thick) film sheet stock.

SUMMARY OF THE INVENTION

The present invention is a method for applying high performance multilayer optical interference coatings to polymeric substrates of complex curved topography, such as Army specification designed helicopter pilot visors to provide eye protection from laser weapons. The visors or other polymeric substrates are coated by plasma enhanced chemical vapor deposition (PECVD). The polymeric substrates are loaded into the reaction zone of the deposition apparatus. Vacuum pumps are used to evacuate the work chamber (including residual atmospheric background) and "outgas" the substrates. Deposition materials are then introduced into the reaction zone along with an inert carrier gas and reactive agents. Excitation of the plasma allows chemical and thin film forming processes to occur which would normally be thermodynamically impossible at low temperatures. The starting reactant has the form M—R (i.e., a general description for the organo-metallic class of molecules) where M is a metal and R is an organic component.

A feature of the invention is the use of an electrode/reactant feed structure for coating parts of complex geometry. The invention has a passive electrode, biased by its own power supply, which is machined to fit and accommodate the polymeric substrate. A driven electrode is complimentary to the contour on the passive electrode and is separated therefrom by a gap in which the plasma reaction occurs and where the substrate is placed. A reactant feed tube transports reactants through the driven electrode to the gap or reaction chamber. The device includes side shields to confine the plasma in the gap or reaction zone. An optical monitor is used to measure the thickness of the deposition.

The deposition apparatus incorporates shaped electrode geometry which enables objects of complex topology to be coated with thin films having thickness uniformity tolerances within a few percent of the wavelength of visible light, over the coated surface of the object.

While the present invention has particular advantages for the coating of complex-shaped polymeric substrates, the invention is applicable to the coating of flat surfaces (by definition, a flat surface has an infinite radius of curvature) and inorganic substrates as well. These materials include standard optical glasses (as manufactured by Corning, Inc., and Schott Glasswerke whose importer is Schott America Glass and Scientific Products, Inc.) and ultra-low expansion (ULE) materials, such as Corning's Cer-Vit and Schott's Zerodur, which are commonly used for ring laser gyroscope (RLG) mirror substrates. Also, many practical RLG designs employ curved mirror elements to improve laser optical output stability (i.e., of the so-called long radius resonator configuration). The present invention is particularly useful for coating such curved mirror components.

Another advantage is that the invention, with the use of various miscible visible vapor phase material mixtures, can produce sophisticated optical interference coatings having a continuous gradient index variation, as well as the conventional discrete index interface multilayer type.

A further advantage is that the thin solid films are formed directly from the gas/vapor phase source materials at a relatively low temperature with only one state of matter (vapor-to-solid) change. This type of formation is in contrast to the more usual methods of optical thin film coating such as electron-beam evaporation which involves the high temperature transformation of a solid phase source material to the vapor phase (for transport), then back to a solid thin film. The simpler, more direct film-forming path of this invention leads to a less likely inclusion of extraneous solid phase debris in the coating (referred to as "spits" in e-beam coatings) and thus superior (i.e., lower) optical scattering loss performance. This inherent low scatter loss advantage has particular applicability to RLG coatings and components for which scatter loss is a critical issue, as well as for the more mundane mirror, beamsplitter, color separation filter, anti-reflection, etc. coating applications.

DESCRIPTION OF THE PREFERRED EMBODIMENT

Figure 1:
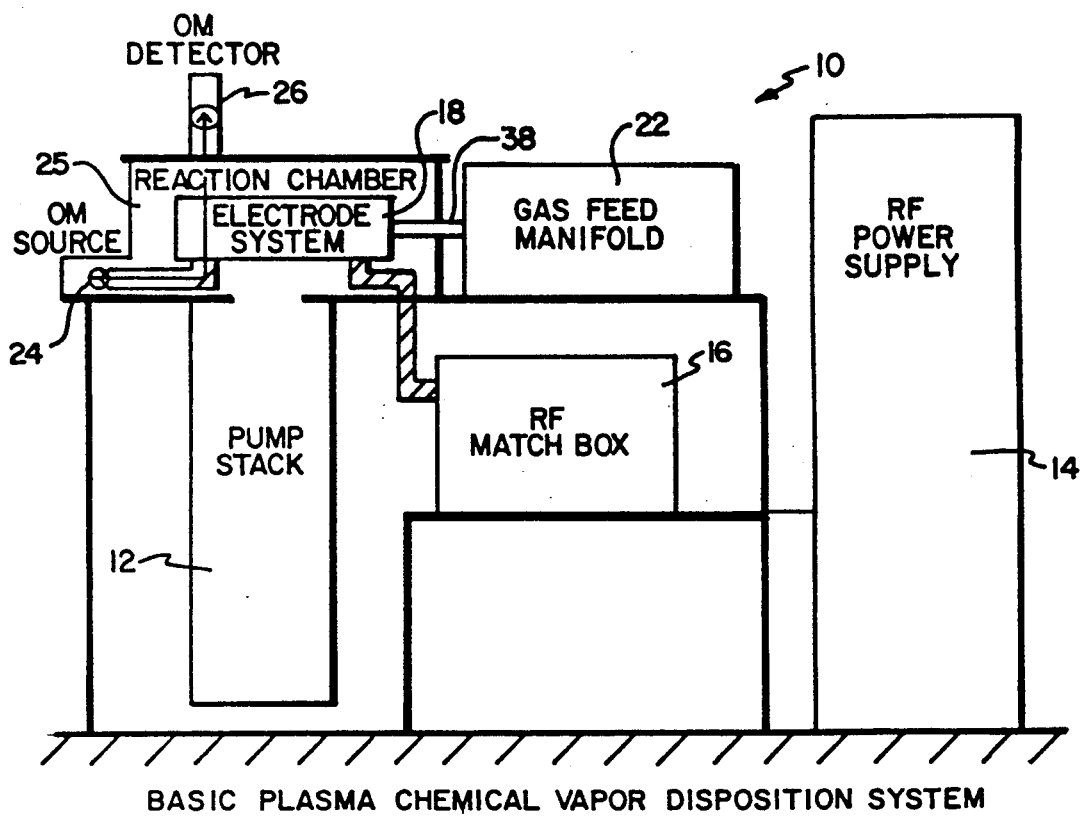
FIG. 1 is a cutaway diagram of the associated apparatus for coating.

FIG. 1 shows the basic components of a plasma enhanced chemical vapor deposition (PECVD) reactor 10. Container 25 houses an optical monitor and chamber 18. There is a pump stack or vacuum pumping system 12 for evacuating reaction chamber or zone 18 to outgas parts and to achieve operating pressures for establishing a process plasma. Pumping system 12 is connected to reaction chamber 18 with a pipe means between pump 12 and chamber 18 for enabling the evacuation of certain matter or gases from chamber 18. Within chamber 18 are two electrodes 28 and 34. Between electrodes 28 and 34 is a space or zone 44 where the item to be coated is placed and a deposition process occurs. Radio frequency (RF) power supply 14 and impedance matching network 16 drive electrodes 28 and 34 to establish a plasma to promote chemical reactions involving M—R components to allow the formation of a high quality thin film. Electrode 34 is a driven electrode whereas electrode 28 is a passive electrode. Power supply 14, via network 16, has one terminal connected to electrode 34 and another terminal connected to electrode 28 via a ground or reference voltage. Gas and reactant feed manifold 22 is for monitoring and feeding reactants to plasma reactor zone 44. Gas and reactant substances are supplied to chamber 18 through pipe 38 from gas feed manifold 22. Pipe 38 connects gas feed manifold 22 to electrode 34 having pores through which gas and reactants enter zone 44. The gap or zone 44 is the space between electrodes 28 and 34 where the plasma, reaction and coating occur. The optical monitor (OM) instrument is within container 25. The OM, having an OM source 24 and OM detector 26, precisely monitors the thin film optical thickness, with a beam of light going from source 24 into chamber 18, through tunnel 52 of the electrodes 28 and 34, through the coated object, and to detector 26, thus allowing the fabrication of precisely tuned multilayer optical interference coatings.

Vacuum pumping system 12, power supply 14, impedance matching network 16 and feed manifold 22 are standard components readily available in the market place, and are common to several plasma reactor designs commercially available from several manufacturers. Such designs include the center-pumped flat plate reactor which is widely used to deposit silicon nitride passivation layers in the semiconductor industry.

The optical interference instrument comprising source 24 and detector 26 is a specialized component not commonly used with chemical vapor deposition processes of any sort, but often used in conventional physical vapor deposition of optical interference coatings. These devices are available from several companies including Eddy Co. of Lafayette, Calif., and Balzers of Liechtenstein.

Figure 2:
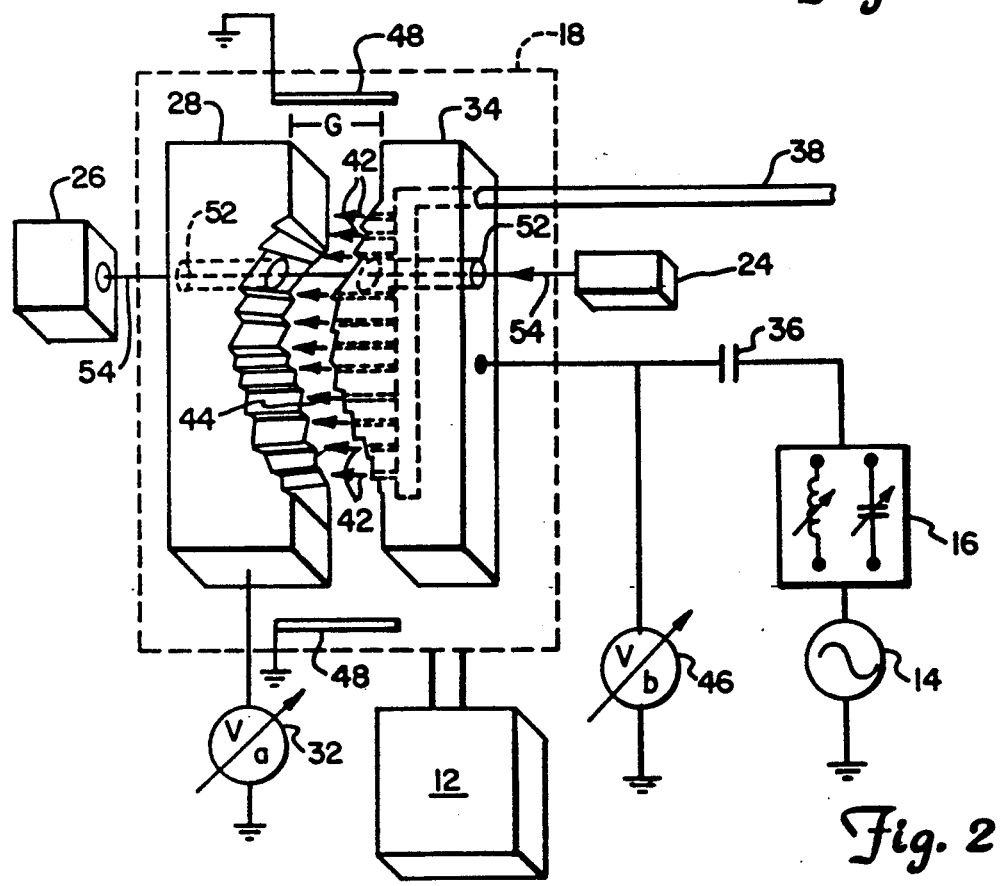
FIG. 2 is a detailed illustration of the electrode assembly.

Electrode and reactant feed structure 18 is the aspect of the reactor design and invention which allows the application of plasma enhanced chemical vapor deposited thin film to complex shaped parts. FIG. 2 illustrates the components of electrode and reactant feed structure 18. Electrode 28 is passive and specially machined into a shape to accommodate a portion of a three dimensional contour, i.e., C(r), where C(r) is a function of a radius describing the profile of a part to be coated, relative to a convenient coordinate system. The substrate item to be coated may be placed on electrode 28 having a convex shape for coating the item's convex side or on an electrode 28 having a concave shape for coating the item's concave side. Electrode 28 in FIG. 2 has a concave shape. Electrode 28 is made of electrically conducting material and can be biased, as needed to enhance coating properties, with a positive or negative electrical potential (at voltage $V_a$) relative to electrical ground. A passive electrode bias power supply 32 provides bias voltage $V_a$ as required. $V_a$ is typically equal to zero volts and thus electrode 28 is at the potential of the system reference or electrical ground point.

Driven electrode 34 is driven by RF power supply 14 together with impedance matching network 16 through a capacitor 36. Capacitor 36 is for coupling the RF power while blocking direct current (DC) power. Driven electrode 34 has a three dimensional contour —C(r) which is complementary to the contour of passive electrode 28. Driven electrode 34 is separated from passive electrode 28 by a gap of distance G. Distance G is typically from five to ten centimeters and the plasma reactor 10 is operated in the one to two hundred millitorr pressure range.

Driven electrode 34 is connected to reactant manifold 22 via reactant feed tube 38 made of an electrically insulating material. The reactants diffuse through strategically placed delivery orifices or jets 42 in the driven electrode 34 into the interelectrode reaction zone 44. The placement of jets 42 is such that uniform coating thickness is achieved over contour C(r).

Bias power supply 46 independently and electrically biases driven electrode 34 at $V_b$ ranging from zero to negative several hundred volts DC.

Electrostatic side shields 48 serve to confine the plasma in gap zone 44 between electrodes 28 and 34. Side shields 48 effectively form a Faraday cage. Side shields 48 are made of a conducting material and are normally held at an electrical ground potential. The use of shields 48 considerably improves the efficiency of the deposition process. In other words, a pair of shields 48 cause reactant utilization to form thin films preferentially on the substrate rather than on extraneous wall areas.

Access tunnel 52 goes through electrodes 28 and 34, tunnel 52 of both electrodes 28 and 34 being aligned and allowing probe light beam 54 from optical monitor source 24 to be transmitted through the substrate being coated and on to detector 26 which measures the amount of light beam 54 transmitted thereby resulting in an indication of the amount of coating on the substrate.

Figure 3:
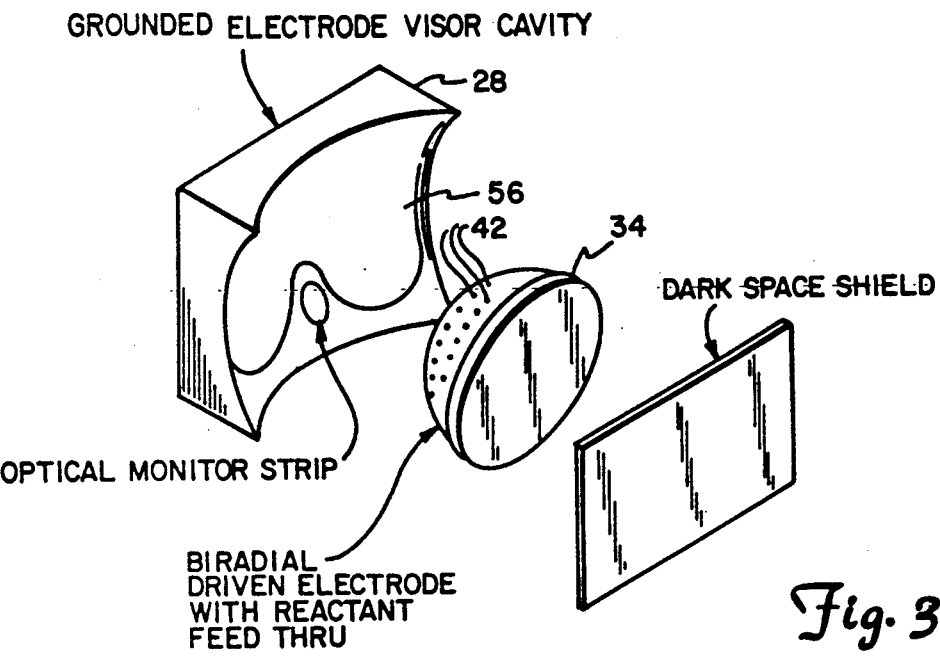
FIG. 3 is a perspective of an actual electrode system for coating a single visor.
Figure 4:
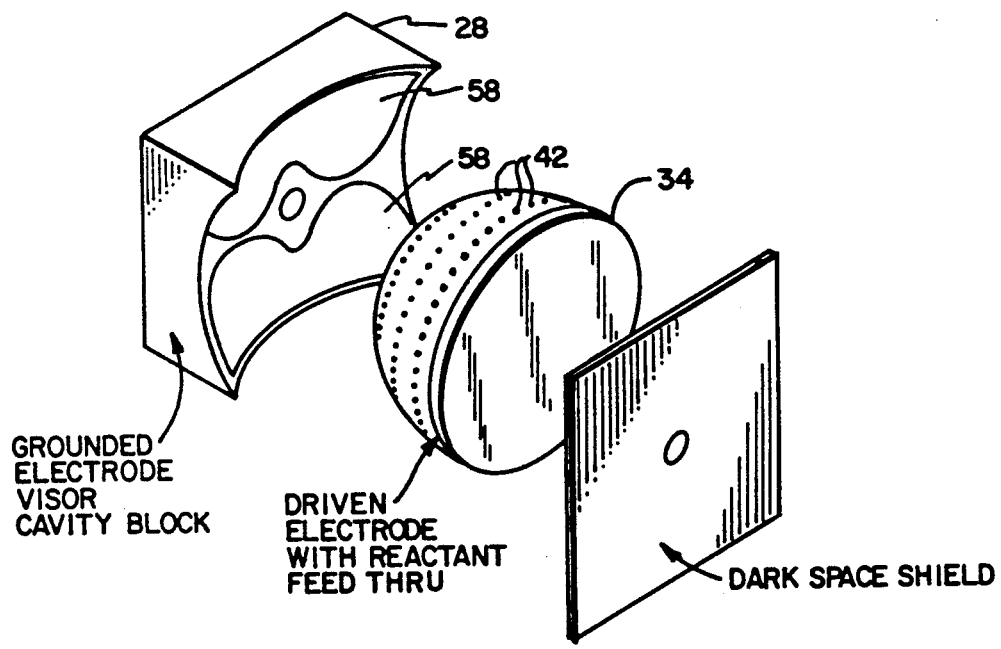
FIG. 4 is an illustration of an electrode system for coating two visors.

FIG. 3 shows electrodes 28 and 34 having contours designed for accommodating the coating of the biradially curved inside surface of aviator visor 56. Similarly, FIG. 4 shows electrodes 28 and 34 designed for simultaneously coating two visors 58.

Figure 5:
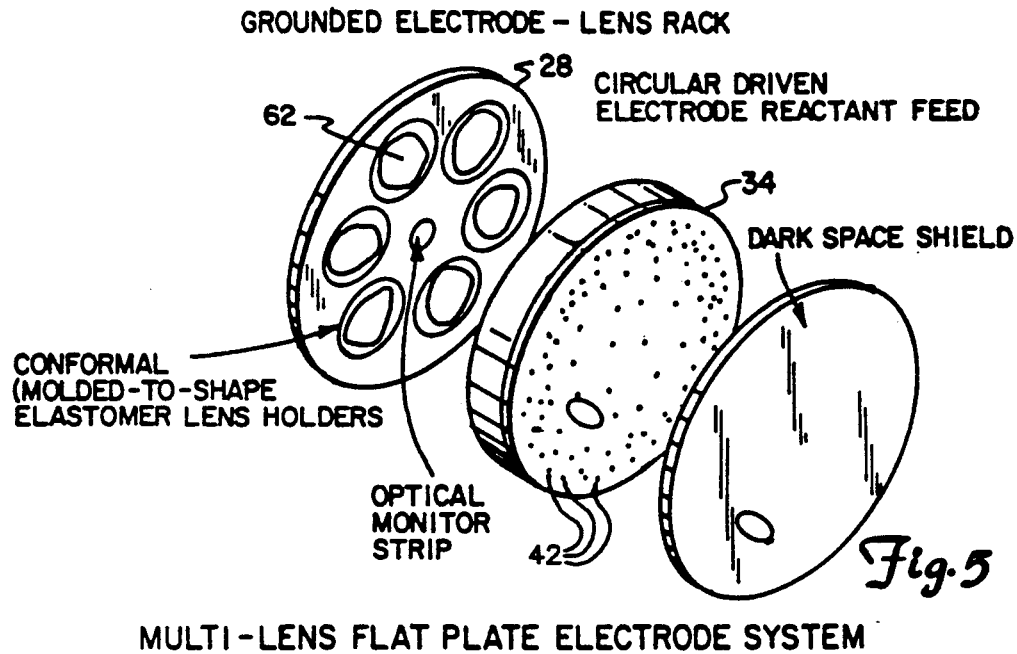
FIG. 5 shows a multi-lens flat plate electrode system which may also be used to coat curved ring laser gyroscope mirror substrates.
Figure 6:
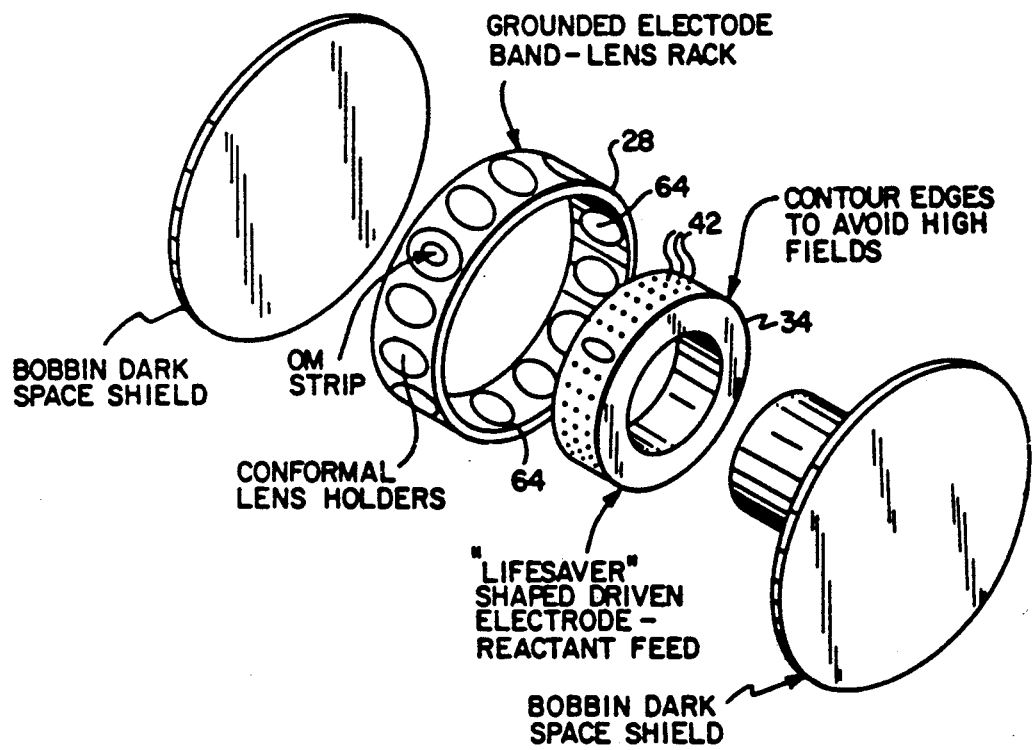
FIG. 6 shows a multi-lens toroidal electrode system.
Figure 7:
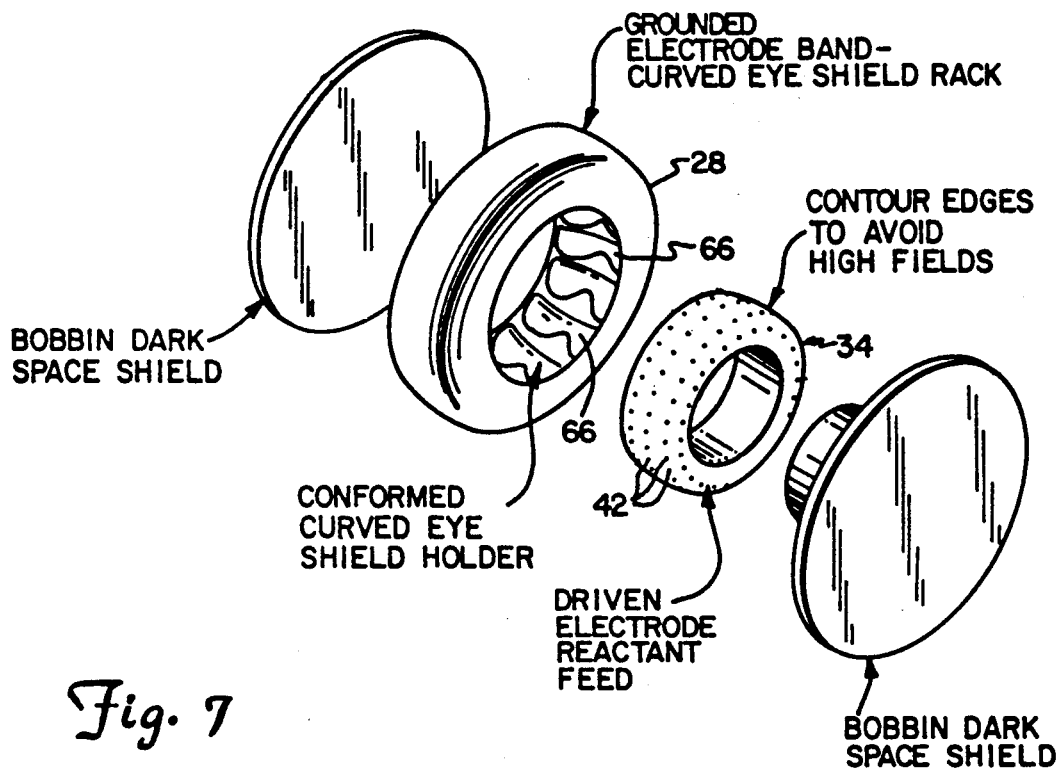
FIG. 7 shows a multiple eye shield toroidal electrode system.
Figure 11:
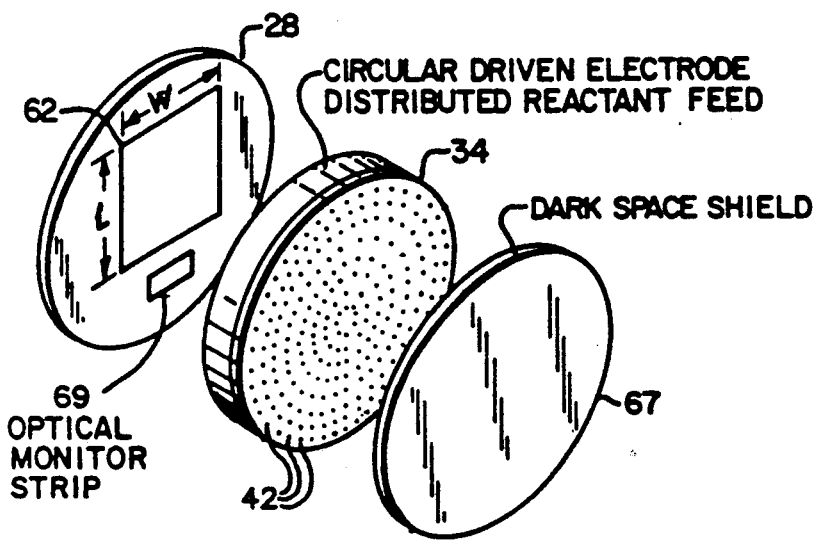
FIG. 11 reveals an electrode system for coating a single flat substrate having dimensions of wxl.
Figure 12B:
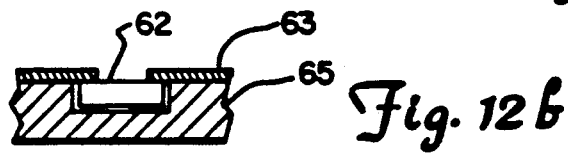
FIGS. 12a and 12b reveal an electrode system for coating multiple flat substrates, such as Zerodur ring laser gyroscope mirror blanks.
Figure 12A:
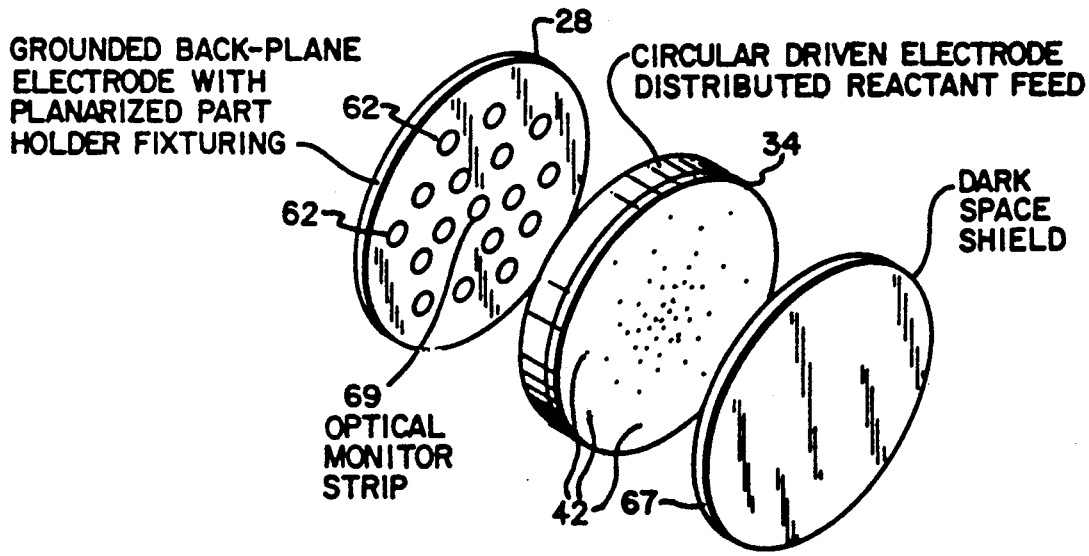

FIG. 5 illustrates a multi-lens batch coating system having electrodes 28 and 34 designed for multiple lens 62 batch coatings. Such a system can be used to coat hemispherically curved ring laser gyroscope mirror substrates. FIG. 6 shows toroidal shaped electrodes 28 and 34 for multiple lens 64 batch coatings. FIG. 7 similarly shows toroidal shaped electrodes 28 and 34 for multiple eye shield 66 batch coatings. FIG. 11 shows an electrode system designed to coat a single flat rectangular substrate 62 (of dimension wxl) mounted on grounded electrode substrate holder 28. Also part of the FIG. 11 assembly are circular driven electrode distributed reactant feed 34 and dark space shield 67. For monitoring the application of the coatings, monitor strip 69 is utilized in the electrode systems of FIGS. 11 and 12a. FIG. 12a shows fixture 28 for the batch coating of multiple flat RLG substrates 62. Fixture 28 is a grounded back-plane electrode with a planarized part or substrate holder. The multi RLG mirror electrode system of figure 12a also includes circular driven electrode distributed reactant feed 34 and dark space shield 67. FIG. 12b is a cross section of RLG substrate 62 showing mirror aperture mask 63. Substrate 62 is a ULE Zerodur mirror substrate blank. Substrate is set in a recess in a pocket of insulating material 65 such as acrylic or Teflon (Ardel).

In the method of plasma enhanced chemical vapor deposition, the parts to be coated are loaded into reaction zone 44 (FIG. 2) of deposition apparatus or plasma reactor 10 (FIG. 1). Vacuum pumps 12 are incorporated in apparatus 10 to thoroughly out-gas the polymeric substrate in a typical process cycle of $10^{-6}$ Torr $\times 2$ hours at room temperature. Deposition materials are then introduced into reaction zone 44 along with inert carrier gases (such as Xe or Ar) and appropriate reactive agents (for example, oxidizers $O_2$ or $N_2O$, or reducing agents like $H_2$). The reactant flow rates and reaction zone 44 pressures are then set (with typical flow rates in the one to ten standard cubic centimeters per minute (SCCM) range and pressures in the $10^{-3}$ to $10^{-2}$ Torr range for a 0.5 to 1.0 cubic meter reactor zone 44 volume) prior to exciting a plasma (by an electrical discharge) in reactor zone 44. The excitation of the plasma allows chemical and physical thin film forming processes to occur which otherwise would be thermodynamically impossible at low process temperatures (typically in the 20 to 100 degree Centigrade range). The reason for such process occurrences is that the activation energy for these processes is provided collisionally and through charge exchanges, rather than thermally (i.e., through kT energy).

The materials for optical quality thin films may be obtained from starting reactants of the form

M—R where M denotes a metal atom (e.g., Ti, Zn or Sn) and R denotes an organic component (such as from an alkyl or alkoxide group). By adjusting plasma reactor 10 parameters (which include radio frequency (rf) power, electrode direct current (dc) bias voltage, reactor pressure, reactant flow rates, reactor pumping speed and substrate temperature), films deposited from these reactants in a reactive (oxidative) atmosphere may have physical properties ranging from the purely organic to the purely inorganic, depending upon the relative proportion of M (i.e., the inorganic phase, usually incorporated as $MO_x$, a metal oxide) and R (i.e., the organic phase). These materials and system 10 make for an ideal application of high performance optical films well matched to the physical and chemical properties of polymeric substrates.

Figure 8:
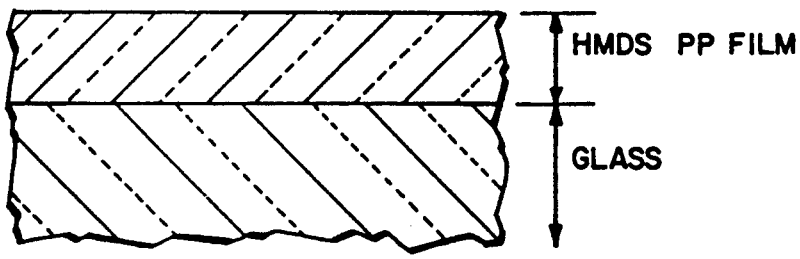
FIG. 8 is a side view of a single layer plasma polymerized hexamethyldisiloxane film on glass.
Figure 9:
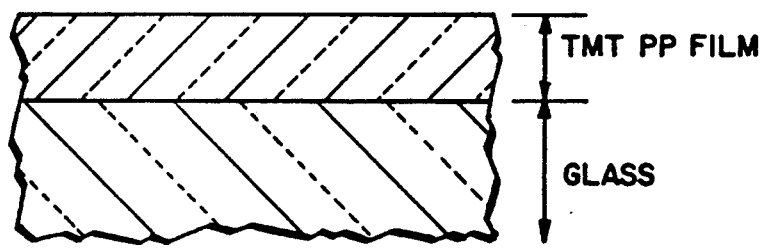
FIG. 9 is a side view of a single layer plasma polymerized tetramethyltin on glass.
Figure 10:
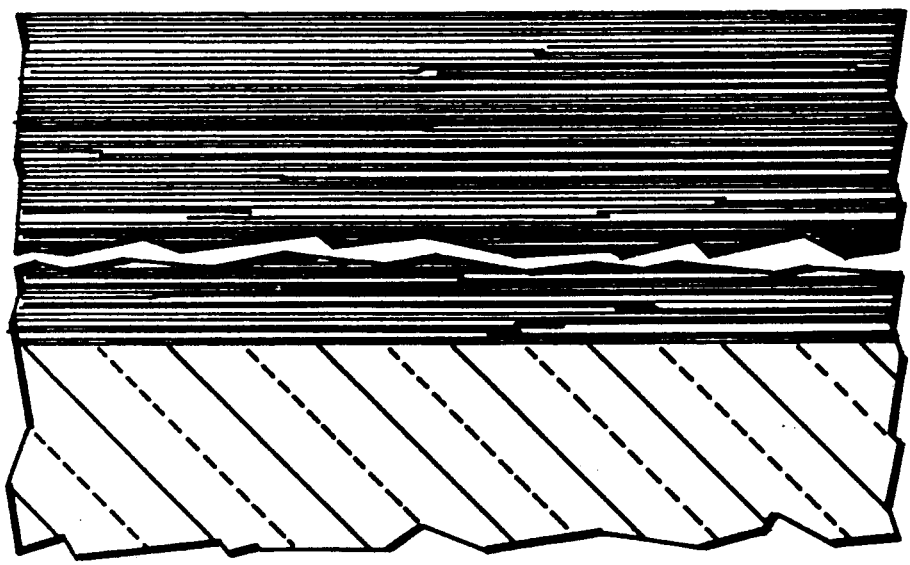
FIG. 10 is a side view of a multilayer plasma polymerized film.

FIGS. 8–10 are scanning electron micrographs which reveal the unique microstructure of thin films formed from materials with plasma enhanced chemical vapor deposition in system 10. FIG. 8 is of a cross section of film formed from hexamethyldisiloxane (HMDS). FIG. 9 is a similar cross sectional view of a film formed from tetramethyltin (TMT, i.e., M=Sn and $R=(CH_3-)_{n=4}$). FIG. 10 is a cross section of a multilayer optical interference coating fabricated from two materials used for the films of FIGS. 8 and 9.

The above-noted graphs reveal the films to be highly dense, glassy and amorphous, exhibiting none of the microvoid columnar structure typical of materials deposited by conventional techniques. The close-packed microstructure of the resulting films of the present invention, along with excellent optical performance and extreme mechanical flexibility (afforded by the organic phase which imparts elastomeric qualities of the films) are unique to plasma enhanced chemical vapor deposition thin films produced from this class of materials.

Thin film coatings may be deposited on a ULE (ultra-low expansion) substrate 62 (such as Zerodur) as illustrated in an electrode system of FIG. 12. Such coated substrates 62 are designed to function as mirrors in a ring laser gyro system. The substrate is an ultra low expansion (ULE) substrate which may be a glass ceramic or a Zerodur substrate by Schott Glasswerke, or a Cer-Vit substrate made by Corning, Inc. The coatings typically deposited on such substrates are from organometallics precessors, particularly, Zn, Ti, Zr, Ta, and Si bearing organics.

Figure 13:
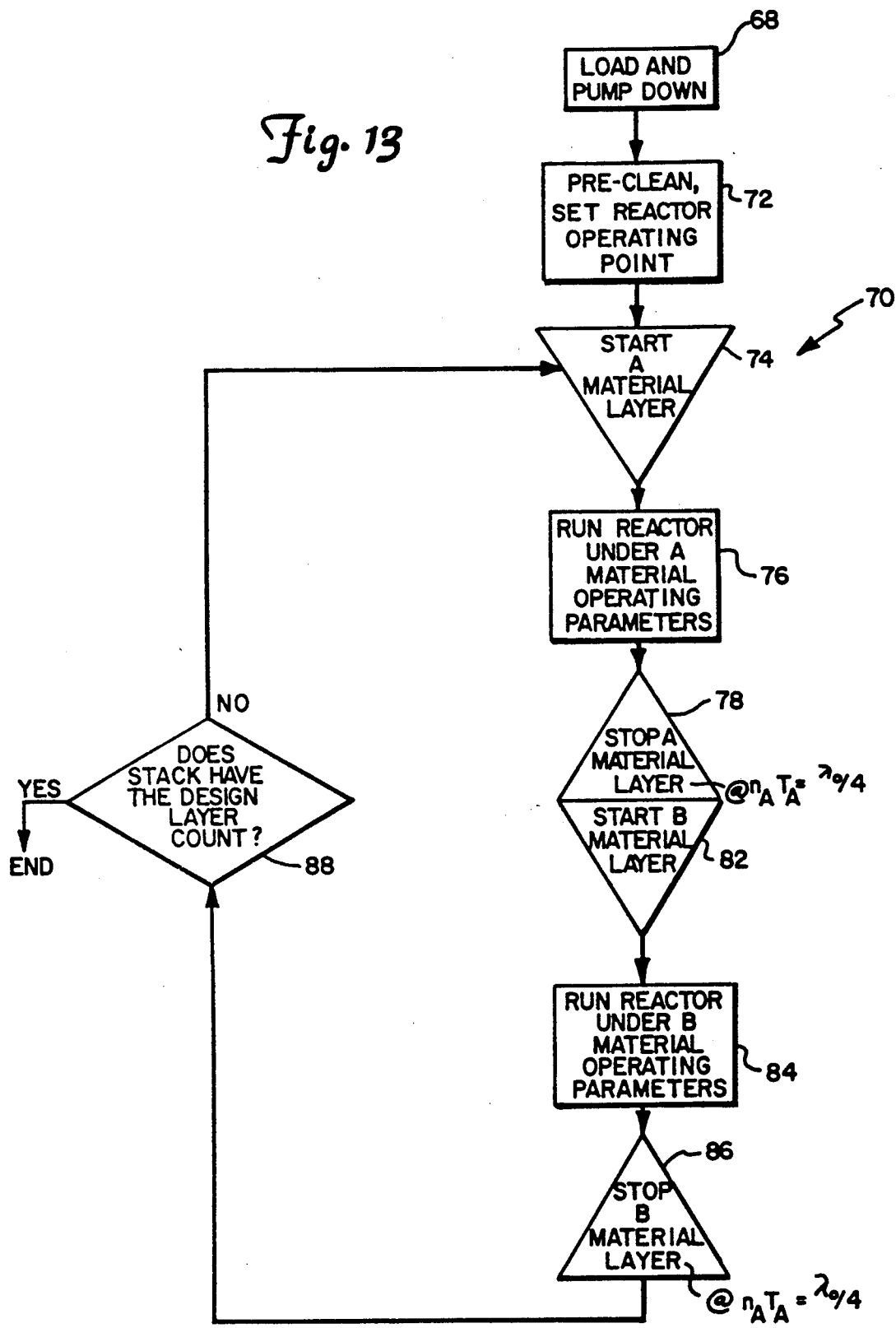
FIG. 13 is a method diagram for obtaining a quarter-wave multilayer stack coating.
Figure 14:
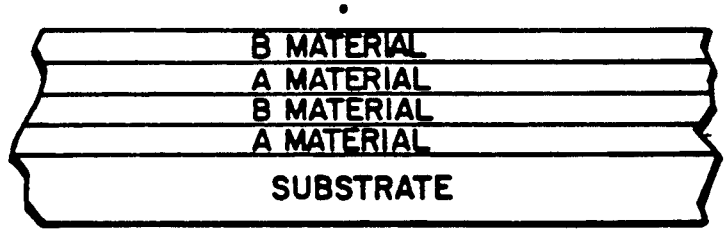
FIG. 14 shows an alternating layer configuration.

FIG. 13 shows method 70 for depositing a quarter-wave multilayer stack coating such as a ring laser gyro mirror design. Step 68 is the loading and pumping down of the deposition chamber. The deposition materials are introduced into the reaction zone of the chamber, along with an inert carrier gas and reactive agents. Step 72 involves a pre-cleaning step and setting the reactor's operating point and parameters for the present coating of items. Step 74 involves a selection of material A and the process of coating the item to be coated under the selected operating parameters. Step 76 is running the reactor under the selected operating parameters for material A. During step 76, the optical thickness of the depositing thin film is monitored for a given layer n where n is the number of A or B material layers. Both A and B may be mixtures of several gas phase source materials. The relationship of the layer thickness, $T_A$, $T_B$, to wavelength is shown by $n_A T_A = n_B T_B = \lambda_o/4$, layer optical thickness, where $n_A$ and $n_B$ are the respective refractive indices of the A and B layers and $\lambda_o$ is the center wavelength tuning. Step 76 is completed upon the occurrence of step 78 which results in a finished layer of material A, and the start of the B material layer at step 82. At step 78, $n_A T_A$ is equal to $\lambda_o/4$. Similar to the A material layer, step 84 is running the reactor under selected operating parameters for material B. During step 76, the optical thickness of the deposition process is monitored for a given layer n of B material. Step 86 is achieved when $n_B T_B$ reaches the design end point (i.e., $\lambda_o/4$) for the layer of B material. Next step 88 asks the question of whether the layer stack has attained the design layer count. If not, then another set of layers of materials A and B is added; if so, then the multilayer process is ended. FIG. 14 shows the configuration of layers for materials A and B.

Figure 15:
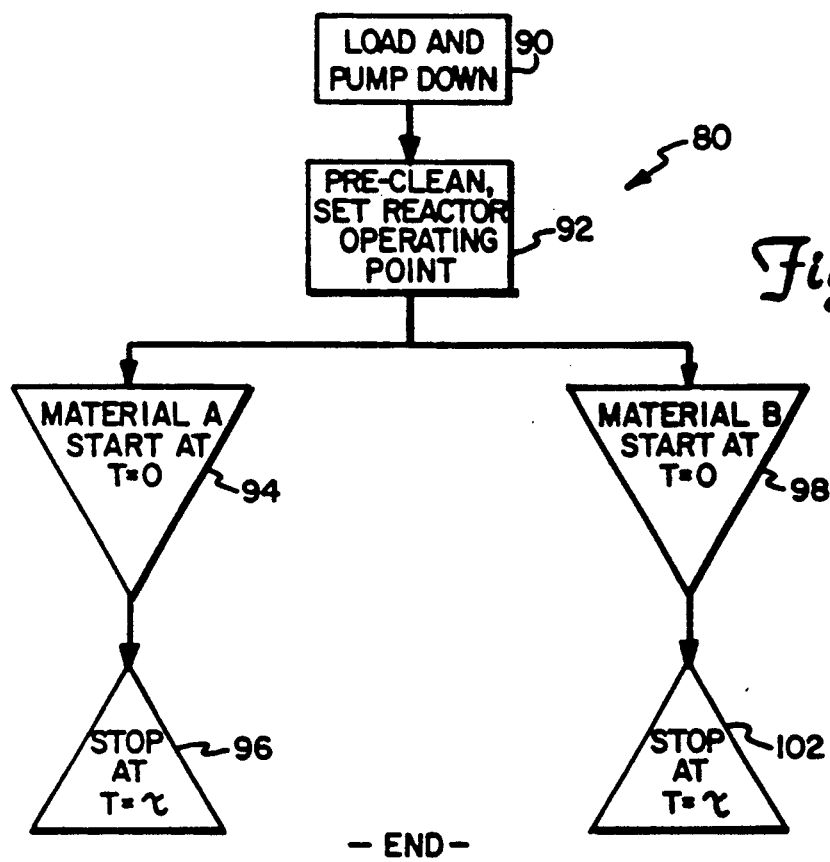
FIG. 15 is a method diagram for depositing a gradient index of refraction.

In FIG. 15, the diagram of method 80 outlines the process for depositing a gradient index anti-reflection coating using a miscible binary materials system. Steps 90 and 92, loading and pumping down, and precleaning and setting the reactor operating point, respectively, are similar to steps 68 and 72 of FIG. 13. Materials A and B are applied simultaneously in varying proportions to obtain the design index of refraction profile of the applied film. Steps 94 and 98 start the application of materials A and B at time equal to a referent zero (T=0). The stop points 96 and 102 are activated at the end of the process deposition time (T=$\tau$). $F_A(t)$ and $F_B(t)$ are the temporal reactant flow schedules to obtain a design index profile of the film being deposited on a given substrate. Real time closed-loop index monitoring (for example, by in situ ellipsometry) could also be used to meter $F_A(t)$ and $F_B(t)$ to achieve the desired index profile.

Figures 16A, 16B:
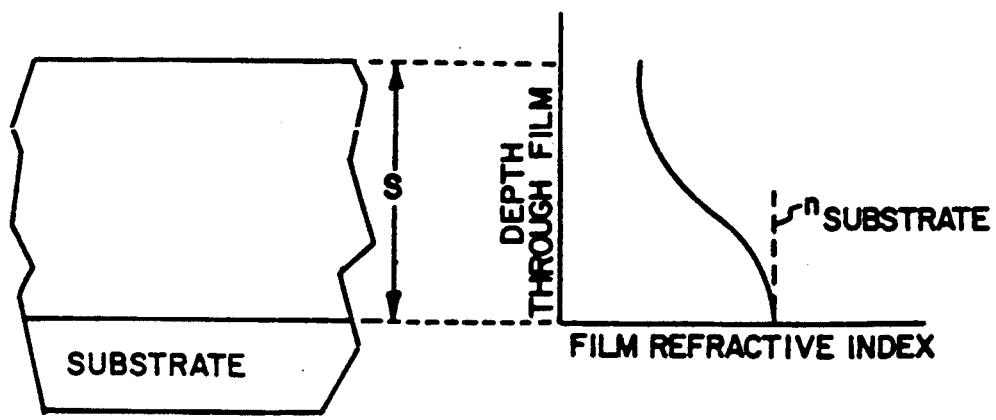
FIGS. 16a and 16b show a gradient index coating and an associated graph of the index.

FIG. 16a illustrates the resultant film having a gradient index design for a thickness S. FIG. 16b shows the film's refractive index as the depth through the film varies from the substrate-film interface to the top of the film.

Figure 17:
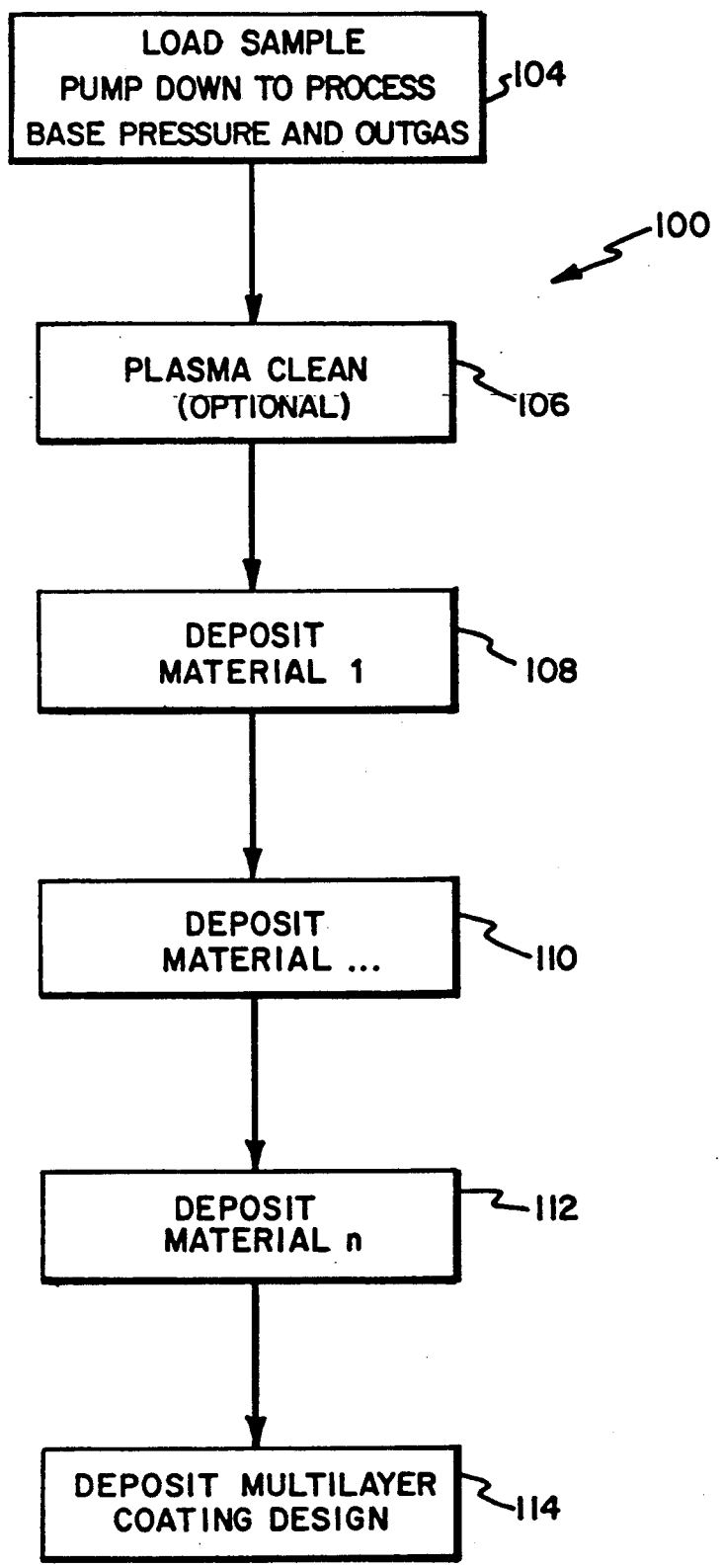
FIG. 17 summarizes a deposition method sequence for multilayer coatings.

FIG. 17 is an outline of method 100 for depositing a multitude of kinds of materials as films on a substrate. In step 104, the sample to be covered with thin films is loaded into a like-shaped electrode holder in a reaction chamber. The reaction chamber is pumped down to the process base pressure which is typically in the $10^{-6}$ Torr (T) range. To outgas the sample, the chamber is held at about $10^{-6}$ T for two hours at room temperature. Step 106 involves an optional plasma clean of the sample. A flow of reactive gas (e.g., $O_2$ or $H_2$) and/or inert gas (e.g., Ar or Kr) is let into the reactor. The pumping speed, flow rates and pressure points are set. The plasma is ignited, the radio frequency (RF) match is made, the RF power is set and the direct current (DC) bias is set. The sample is exposed to the cleaning plasma for a prescribed time which is typically about ten minutes.

Step 108 is the depositing of the first film of material 1. The thin film layer source gases are bled, the reactor operating point is set for material 1 and the thin film is deposited to the design layer thickness. Carrier gas and/or reactive gas might be added. The deposition is monitored by physical layer thickness or optical thickness which is the index of refraction multiplied by the physical layer thickness. Step 110 indicates the process for layers 2 . . . of materials 2 . . . . Step 112 indicates the process for the last layer of thin film which is layer n of material n. The processes for steps 110 and 112 are similar to that of step 108. Step 114 is the deposition of a coating on the thin film structure for protection or other purposes.

While a particular embodiment of the invention has been shown and described, it will be obvious to those skilled in the art that alternatives, changes and modifications may be made without departing from the invention in its broader aspects.

The following is claimed:

1. A method for applying high performance multilayer optical interference coatings to a substrate of complex curved topography comprising:

positioning a substrate to be coated in a reaction zone located between first and second electrodes which are shaped to match the contour of said substrate, said reaction zone and said electrodes being within a chamber;

pumping gas components out of said chamber; applying power to said first and second electrodes, resulting in an electromagnetic field between said first and second electrodes;

maintaining a particular pressure within said chamber; and feeding a substance into said reaction zone through a plurality of orifices in said second electrode, said substance reacting into a plasma of said substance, which in turn results in a plasma enhanced chemical vapor deposition in the form of a thin film upon said substrate.

2. Method of claim 1 further comprising confining, by use of shields, said plasma within said reaction zone.

3. Method of claim 2 further comprising monitoring a thickness of said deposition upon said substrate.

4. Method of claim 3 wherein said feeding said substance into said reaction zone comprises feeding at least one inert carrier gas and at last one reactive agent into said reaction zone.

5. Method of claim 4 wherein said inert gas is one of a group including argon, xenon, neon, helium, and krypton.

6. Method of claim 5 wherein said reactive agent is one of a group including $O_2$, $N_2O$, and $H_2$.

7. Method of claim 6 wherein said particular pressure is within a $10^{-3}$ to $10^{-2}$ Torr range.

8. Method of claim 7 wherein said substance comprises a starting reactant in the form of M—R wherein M denotes a metal atom and R denotes an organic component, said substance being deposited as a thin film upon said substrate in a reactive atmosphere having said reactive agent, having a physical property from a group of properties ranging from the organic to the inorganic, said physical property being determined at least in part by a relative proportion of M and R.

9. Method of claim 8 wherein said substrate is inorganic.

10. Method of claim 9 wherein said substance being deposited is particularly tuned for laser wavelengths utilized in ring laser gyros.

11. Method of claim 9 wherein said substrate is optical glass.

12. Method of claim 11 wherein said substrate is an ultra-low-expansion glass ceramic.

13. A method for applying optical coating to a substrate, comprising:

positioning a substrate to be coated in a reaction zone located between first and second electrodes which are shaped to match the contour of said substrate;

applying electrical power to said first and second electrodes; and feeding a substance into said reaction zone through a plurality of orifices in said second electrode, wherein said substance reacts into a plasma which in turn results in a plasma enhanced chemical vapor deposition in the form of a thin film upon said substrate.

* * * * *